US007055079B2

(12) United States Patent
Lu

(10) Patent No.: US 7,055,079 B2
(45) Date of Patent: May 30, 2006

(54) LIQUID CRYSTAL DISPLAY DRIVING CIRCUIT, VERIFYING APPARATUS AND ERROR TOLERANCE METHOD THEREOF

(75) Inventor: Shi-Hsiang Lu, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 331 days.

(21) Appl. No.: 10/605,011

(22) Filed: Sep. 1, 2003

(65) Prior Publication Data

US 2004/0225931 A1 Nov. 11, 2004

(30) Foreign Application Priority Data

May 6, 2003 (TW) ............................... 92112284 A

(51) Int. Cl.
*G01R 31/28* (2006.01)
*G09G 5/00* (2006.01)

(52) U.S. Cl. ....................... 714/734; 714/726; 345/204

(58) Field of Classification Search ..................... None
See application file for complete search history.

(56) References Cited

U.S. PATENT DOCUMENTS 5,077,521 A * 12/1991 Langford et al. ........... 324/537
6,467,057 B1 10/2002 Wang et al. ................ 714/726
2004/0125090 A1* 7/2004 Hudson ...................... 345/204
2004/0125094 A1* 7/2004 Hudson ...................... 345/204

* cited by examiner

*Primary Examiner*—Christine T. Tu
(74) *Attorney, Agent, or Firm*—Jiang Chyun IP Office

(57) ABSTRACT

A liquid crystal display driving circuit, verifying apparatus and error tolerance method is disclosed. The liquid crystal display driving circuit has a plurality of driving stages each having a plurality of verifying apparatus, a logic operation unit and a driving switch. Each verifying apparatus comprises a storage unit, a data switch and an edge detector. The storage unit receives a first and a second trigger pulse during a first and a second time period and then outputs a first and a second shifted signal that correspond to the first and the second triggered pulse submitted to the storage unit. The first and the second shifted signal are transferred to a first and a second output path through switching the data switch during the first and the second time period. The edge detector receives the first shifted signal and set the second output path to a pre-defined logic potential during the second time period if no edge transition is detected during the first time period. The logic operation unit receives the data on the second output path and executes a corresponding logic operation according the pre-defined logic potential so that the output from the logic operation unit is unaffected by the pre-defined logic potential. The driving switch cuts off the pixel circuit from the driving stage during the first time period but reconnects with the driving stage during the second time period.

13 Claims, 4 Drawing Sheets

LIQUID CRYSTAL DISPLAY DRIVING CIRCUIT, VERIFYING APPARATUS AND ERROR TOLERANCE METHOD THEREOF

CROSS REFERENCE TO RELATED APPLICATIONS

This application claims the priority benefit of Taiwan application serial no. 92112284, filed May 6, 2003.

BACKGROUND OF INVENTION

1. Field of Invention

The present invention relates to a liquid crystal display driving circuit. More particularly, the present invention relates to a liquid crystal display driving circuit, verifying apparatus and error tolerance method thereof.

2. Description of Related Art

Low temperature polycrystalline silicon (LTPS) technique is now frequently used to fabricate the thin film transistors (TFT) on a glass substrate inside a liquid crystal display (LCD) panel. However, the driving circuits for driving various pixels, whether the driving circuits are used for scanning or data transmission, have a relatively unstable production yield. In other words, the yield of the driving circuits on the glass substrate is quite variable when the LTPS technique is used to produce the TFT.

FIG. 1 is a block diagram showing the layout of a conventional liquid crystal display driving circuit. The liquid crystal display driving circuit 10 comprises a plurality of serially connected shift registers 102, 104 and 106. To drive various pixels on the LCD panel, a start-up signal (ST) is first transmitted to the shift register 102. After a preset period (in general a clock cycle), the start-up signal will be transmitted from the shift register 102 to the shift register 104. In like manner, the start-up signal will be transmitted from the shift register 104 to the shift register 106 and subsequent shift registers. The various pixels on the LCD panel are driven by the driving lines 112, 114, 116 that are electrically coupled to the output terminal of the shift registers 102, 104 and 106 respectively.

Because the driving circuit 10 is constructed using serially connected shift registers, problem in any one of the shift register may lead to an erroneous propagation of signals in all subsequently connected shift registers. Reliability is further aggravated by the unstable yield in manufacturing the driving circuit 10 using the LTPS technique.

To alleviate some of the problems caused by a low manufacturing yield for the driving circuits, sophisticated error detection circuits are invented. For example, in U.S. Pat. No. 6,467,057, each driving state includes an additional circuit having a complicated design that occupies considerable area. The introduction of such addition circuit not only increases production cost, but also leads to a decrease in the level of device integration. Otherwise, if the level of integration is maintained at the same level, the probability of having current leaks will increase significantly. All these defects add to the disadvantages of using the LTPS technique.

In addition, stuck-at-zero and stuck-at-one at the output terminals of the shift registers 102 to 106 also cause some problems. Although providing additional shift registers connected in parallel such that the outputs from all these shift registers are logically OR together before sending to the next stage is able to eliminate the stuck-at-zero problem, the stuck-at-one problem at the output terminal of the shift registers still persists.

SUMMARY OF INVENTION

Accordingly, one object of the present invention is to provide a liquid crystal display driving circuit, verifying apparatus and tolerance method thereof such that manufacturers can prevent stuck-at-zero and stuck-at-one phenomenon from occurring at the output terminal of shift registers through the deployment of a simple circuit.

To achieve these and other advantages and in accordance with the purpose of the invention, as embodied and broadly described herein, the invention provides a verifying apparatus for a liquid crystal display driving circuit having multiple driving stages. The verifying apparatus has a storage unit, a data switch and an edge detector. The storage unit receives and stores a first and a second trigger pulse during a first and a second time period respectively. Thereafter, a first and a second shifted signal that correspond to the first and the second trigger pulse in the storage unit are transmitted serially via an output terminal. The data switch is electrically coupled to the output terminal of the storage unit. The data switch is flipped to output from a first output path during the first time period and the data switch is flipped to output from a second output path during the second time period. The input terminal of the edge detector is electrically coupled to the first output path while the output terminal of the edge detector is electrically coupled to the second output path. If no edge pulse is detected within the first time period, the edge detector will maintain a pre-defined logic level in the second output path during the second time period.

This invention also provides a liquid crystal display driving circuit with multiple driving stages. Each driving stage comprises a multiple of verifying apparatus, a logic operation unit and a driving switch. The input terminal of the logic operation unit are electrically coupled to the various second output paths provided by the verifying apparatus. When no edge pulse is detected within the first time period, the predefined logic level in the second output path maintained by the edge detector is used to execute a corresponding logic operation so that the output from the logic operation unit is unaffected by the predefined logic level. The driving switch cuts the pixel circuit off the driving stage during the first time period and connects the pixel circuit to the driving stage during the second period.

This invention also provides a liquid crystal display driving circuit. The liquid crystal display driving circuit comprises a front driving stage and a plurality of subsequent driving stages. The front driving stage receives a first and a second trigger pulse consecutively during a verification test. The subsequent driving stages are coupled to the front driving stage serially. The output terminal of each subsequent driving stage is electrically coupled to the input terminal of the following driving stage and the one thereafter. In addition, the output terminal of the front driving stage is electrically coupled to the input terminal of the following driving stage and the one thereafter.

This invention also provides an error tolerance method for a liquid crystal display driving circuit having at least one driving stage with a multiple of verifying apparatus. Each verifying apparatus comprises a storage unit for holding driving signals. The error tolerance method includes receiving a preset trigger pulse. The trigger pulse transmitted via the storage unit is checked for any signs of abnormality. If the trigger pulse via the storage unit is found to be abnormal, the output from the verifying apparatus is fixed at a predefined logic level. Finally, according to the predefined logic level, a corresponding logic operation is executed so that the result of the logic operation is ultimately unaffected by the predefined logic level.

In one embodiment of this invention, the means of checking any abnormality in the trigger pulse transmitted via the storage unit includes sending the trigger pulse into the storage unit for storage and then retrieving the data from the storage cell inside the storage unit for holding the trigger pulse. Thereafter, the data is compared with the trigger pulse to determine if both have the same logic variation. If the data and the trigger pulse are found to have an identical logic variation, the transmission of trigger pulse through the storage unit is deemed normal. Otherwise, the trigger pulse through the storage unit is deemed abnormal.

In brief, this invention relies on a comparison of edge variation to verify the normality of logical operation inside a storage unit. When an abnormality is found in the storage unit, the output terminal of the abnormal storage unit is set to a fixed logic potential so that a different logic operation is carried out for each set logic potential level. With this arrangement, a simple circuit can be used to verify the most frequently defective storage unit inside each driving stage. Furthermore, even if one of the storage units is defective, stuck-at-zero or stuck-at-one output in the driving circuit is avoided. In other words, the true output value is always maintained.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
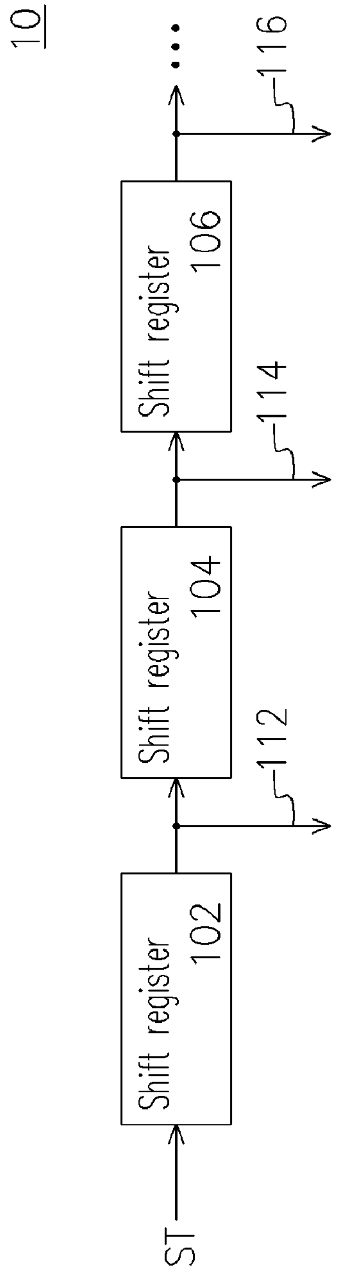
FIG. 1 (PRIOR ART)
FIG. 1 is a block diagram showing the layout of a conventional liquid crystal display driving circuit.

Reference will now be made in detail to the present preferred embodiments of the invention, examples of which are illustrated in the accompanying drawings. Wherever possible, the same reference numbers are used in the drawings and the description to refer to the same or like parts.

Figure 2:
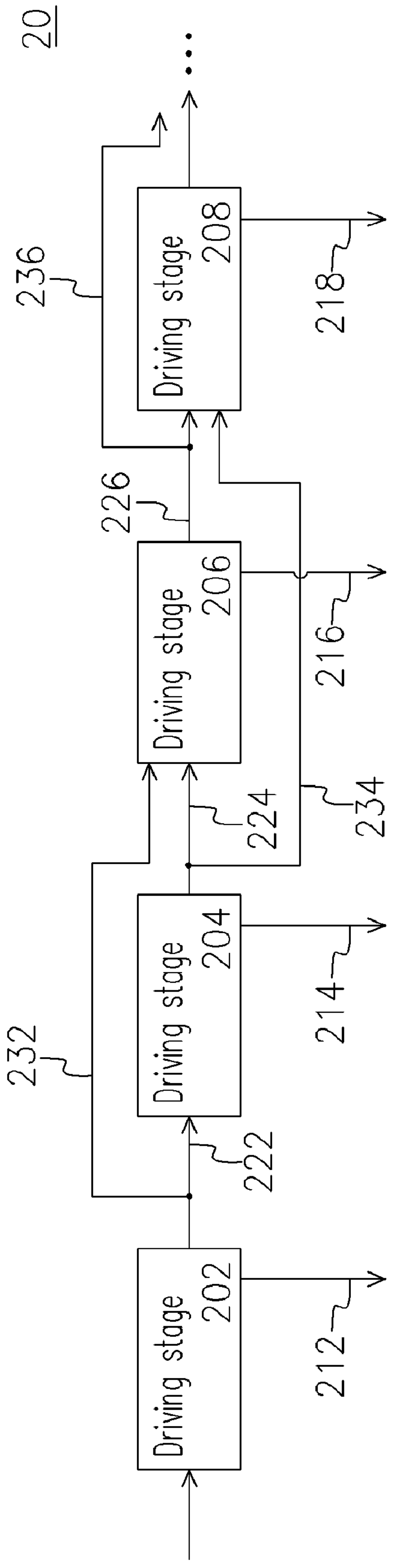
FIG. 2 is a block diagram showing the layout of a liquid crystal display driving circuit according to one preferred embodiment of this invention.

FIG. 2 is a block diagram showing the layout of a liquid crystal display driving circuit according to one preferred embodiment of this invention. As shown in FIG. 2, the liquid crystal display driving circuit 20 comprises a plurality of driving stages 202 to 208. Since the driving stage 202 is located at the front end of the liquid crystal display driving circuit 20, the driving stage 202 is often referred to as the front driving stage while the serially connected driving stages 204 to 208 are referred to as the subsequent driving stages.

In this embodiment, the front driving stage 202 receives outside signals and re-transmits the signals to subsequent driving stages 204, 206 and 208. Furthermore, the output terminal of the front driving stage 202 is also electrically coupled to the input terminal of the following driving stage 204 and the input terminal of the driving stage thereafter 206. Similarly, the other driving stages 204, 206 and 208 also have this type of signal back feeding connections. With this type of connections, if the driving stage 202 receives a first trigger pulse at time t, the driving stage 204 is able to pick up this trigger pulse through the driving stage 202 and the data transmission circuit 222 at time t+1. Meanwhile, the driving stage 206 also picks up the trigger pulse through the driving stage 202 and the data transmission circuit 232 at time t+1. Additionally, the driving stage 206 also receives this trigger pulse at time t+1 via the driving stage 204 and the data transmission circuit 224.

Using the structural connection as shown in FIG. 2, a single trigger pulse sent to the driving stage 202 is transmitted to the driving stage 206 and all subsequent stages as two identical trigger pulses in consecutive time period. Although it appears that this type of structural connection will bring about repetitive display of data on the display panel, this type of circuits is only applied to the testing signals before the actual transmission of data. In fact, after the actual transmission of data is initialized, the excess circuits (including the data transmission circuits 232, 234 and 236 involved in the transmission of data to the next two driving stages) will be cut off. In other words, various driving stages will receive data from the previous driving stage only when actual data needs to be transmitted.

To reduce the system complication, ordinary start pulse produced by a conventional technique is used as the trigger pulse in the testing operation. When actual data needs to be transmitted, the trigger pulses will represent image data signals. However, anyone familiar with the technique may notice that any suitable signal can be used as the trigger pulse, not just the start pulse.

In general, before the actual display data is transmitted, a start pulse will first appear. In this embodiment, if a start pulse is transmitted to the driving stage 202 at time t, the start pulse will be transmitted to the driving stage 204 and 206 in time t+1. Similarly, the start pulse will be transmitted to the driving stage 206 and 208 in time t+2. Through this transmission mode, the driving stage 206 and all subsequent driving stages will receive two start pulses that can be used for testing. In other words, using the driving stage 206 as an example, it will receive a first start pulse at time t+1 and a second start pulse at time t+2. To obtain two start pulses for testing in the driving stages 202 and 204, one more start pulses may be transmitted to them after transmitting the first start pulse. Arrangements can be made to discard the second start pulse before it reaches the driving stage 206 and the other subsequent driving stages.

In addition, because all the driving stages 202 to 208 have their own driving lines 212 to 218 for driving various pixels, circuit arrangements can be made to shut down any output to these lines during the testing operation so that no erroneous signals will be sent to the pixels.

Figure 3:
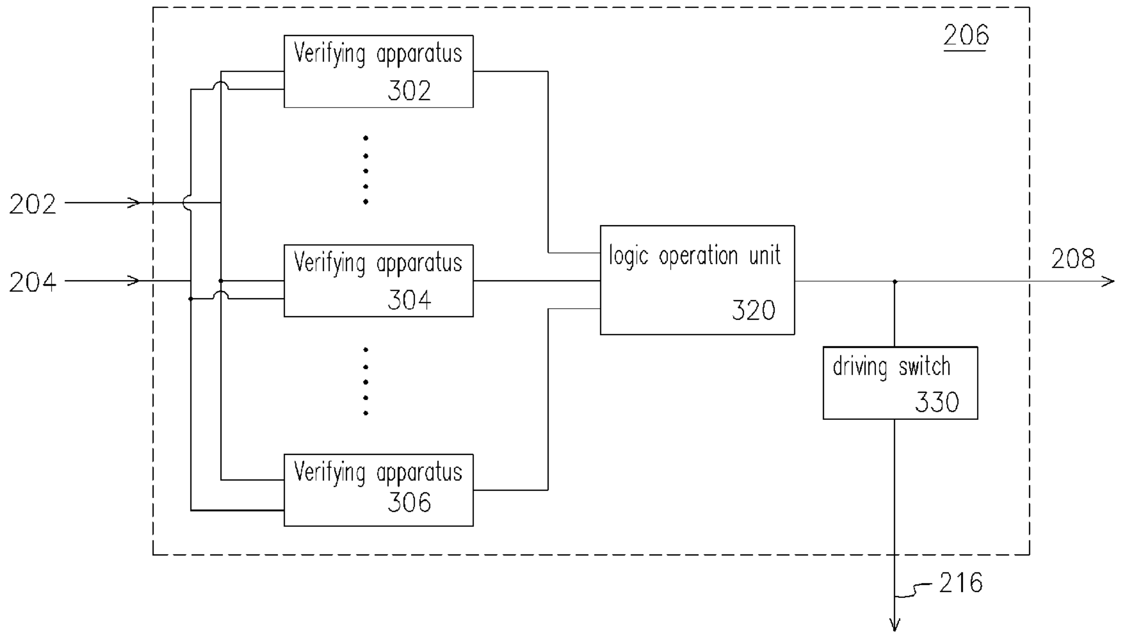
FIG. 3 is a block diagram showing the layout of a driving stage inside a liquid crystal display driving circuit according to one preferred embodiment of this invention.

FIG. 3 is a block diagram showing the layout of a driving stage inside a liquid crystal display driving circuit according to one preferred embodiment of this invention. To simplify subsequent explanations, the driving stage can be assumed to be the driving stage 206 in FIG. 2. With such an assumption, the driving stage 206 will pick up a first start pulse from the driving stage 202 at time t+1 and a second start pulse from the driving stage 204 at time t+2.

In this embodiment, the driving stage 206 comprises a plurality of verifying apparatus 302 to 308, a logic operation unit 320 and a driving switch 330. The verifying apparatus 302 to 308 pick up a signal transmitted from a single source (for example, the driving stage 202 or the driving stage 204) simultaneously. If a particular verifying apparatus discovers some abnormality in the signal after a testing operation, the output terminal of this verifying apparatus is maintained at a pre-defined logic potential. According to this invention, the pre-defined logic potential level is related to the type of logic operation that needs to be carried out inside the logic operation unit 320. In other words, the pre-defined logic potential must be set to a level such that the result of operation inside the logic operation unit 320 is unaffected. For example, if the logic operation unit 320 executes a logic 'OR' operation, the verifying apparatus detecting an abnormality must output a logic '0' signal. Conversely, if the logic operation unit 320 executes a logic 'AND' operation, the verifying apparatus detecting an abnormality must output a logic '1' signal.

With the aforementioned setup between the verifying apparatus 302 to 308 and the logic operation unit 320, the correct result is always obtained after the logical operation inside the logic operation unit 320 if at least one of verifying apparatus signals normality. The correct result then propagates to the following driving stage 208 and the driving stage thereafter (not shown).

In addition, the driving switch 330 permits the selective transmission of the output from the logic operation unit 320 to the driving line 216. With this setup, the driving line 216 is prevented from continuously receiving the output from the logic operation unit 320 in the midst of a circuit testing operation and using that to drive the a corresponding pixel. In other words, the display is prevented from displaying any erroneous image data during circuit testing. For example, the driving switch 330 may utilize timing point restriction or the control signal from a control signal line to isolate the driving line 216 from the output terminal of the logic operation unit 320 electrically when the driving stage 206 receives the first start pulse at time t+1 and/or the second start pulse at time t+2. Without any electrical connection with the driving line 216, pixel-driving pulses are no longer transmitted to the display to produce an erroneous image.

Figure 4:
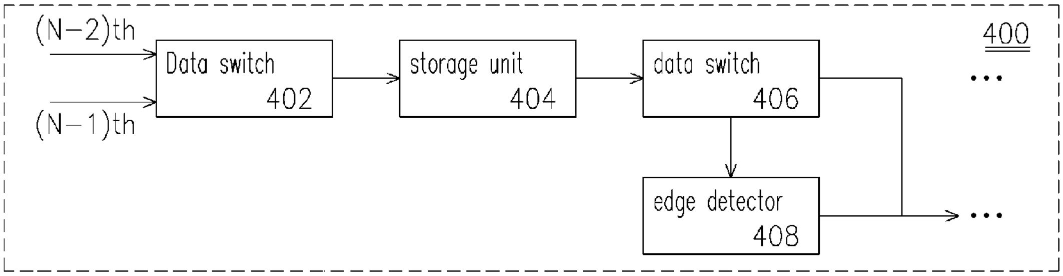
FIG. 4 is a block diagram showing the circuit layout of a verifying apparatus according to one preferred embodiment of this invention.

FIG. 4 is a block diagram showing the circuit layout of a verifying apparatus according to one preferred embodiment of this invention. In this embodiment, each verifying apparatus 400 comprises a first data switch 402, a storage unit 404, a second data switch 406 and an edge detector 408. The output terminal of the first data switch 402 is connected to the input terminal of the storage unit 404. The first data switch 402 has two input terminals. One of the input terminals is connected to the output terminal two driving stages before (that is, the $(N-2)^{th}$ driving stage) and the other input terminal is connected to the output terminal one driving stage before (that is, the $(N-1)^{th}$ driving stage) assuming that the verifying apparatus 400 is within the Nth driving stage. The first data switch 402 receives a trigger pulse from one of these input terminals selectively and then re-transmits this trigger pulse to the storage unit 404.

In general, the storage unit 404 is device comprising shift registers. In this embodiment, the storage unit 404 is capable of receiving trigger pulse in different time periods, holding the trigger pulses and re-transmitting these trigger pulses thereafter. The capacity of the storage unit 404 to re-transmit the stored trigger pulses is important in this invention because the stored trigger pulse inside the storage unit 404 may differ from the originally input trigger pulse due to a circuit problem. To distinguish between the two, the trigger pulse that has been stored inside the storage unit 404 is referred to as a shifted signal.

Assume that the storage unit 404 outputs a first and a second shifted signal during a first time period and a second time period respectively. The second data switch 406 will transmit the first shifted signal to the edge detector 408 (this transmission path is subsequently referred to as the first output path) during the first time period. Thereafter, the second shifted signal to the edge detector 408 (this transmission path is subsequently referred to as the second output path) during the second time period. Aside from the receiving the first shifted signal within the first time period, the edge detector 408 also performs a test to determine if the first shifted signal has the same logic variation compared with the trigger pulse previously input to the verifying apparatus 400. To achieve this function according to the embodiment of this invention, the start pulse serves as the trigger pulse during the testing operation. Since the start pulse is a pulse transition from a logic '0' to a logic '1', the signal received by the edge detector 408 within the first time period should normally include a logic '0' to '1' edge transition.

Utilizing the edge transition concept, the edge detector 408 can easily determine whether the storage unit 404 operates normally or not just from the received signal content. When the edge detector 408 detects some functional abnormality in the storage unit 404, the output terminal having electrical connection with the second output path will be set to a pre-defined logic potential. Since the pre-defined logic potential is related to the type of logic operation deployed by the subsequent logic operation unit, the logic potential should be set according to the actual operating conditions.

Note that although the data switch 402 is used to receive signals from different input sources, the verifying apparatus is not limited to one having this type of structure. For example, if there is only one data source (the $(N-1)^{th}$) for the verifying apparatus 400, the verifying apparatus 400 still can receive a trigger pulse in the first time period and determine if the storage unit 404 is normal or not through the aforementioned circuit operation so that the actual image data received in the second time period can similarly be assessed. Because there is only one data source for in this type of structure, the data switch 402 can actually be deleted.

In the aforementioned embodiment, other circuits are assumed to have no problems so that any problem with the storage unit 404 can be directly deduced. However, other circuits may contain defects leading to the production of erroneous data besides the storage unit 404. Nevertheless, if the verifying apparatus 400 finds a problem in the storage unit 404, the output from the verifying apparatus 400 must be discarded. In other words, the verifying apparatus 400 of this invention is able to eliminate most of the circuit problems that may cause a display error, not just verifying the problem in the storage unit 404.

Figure 5:
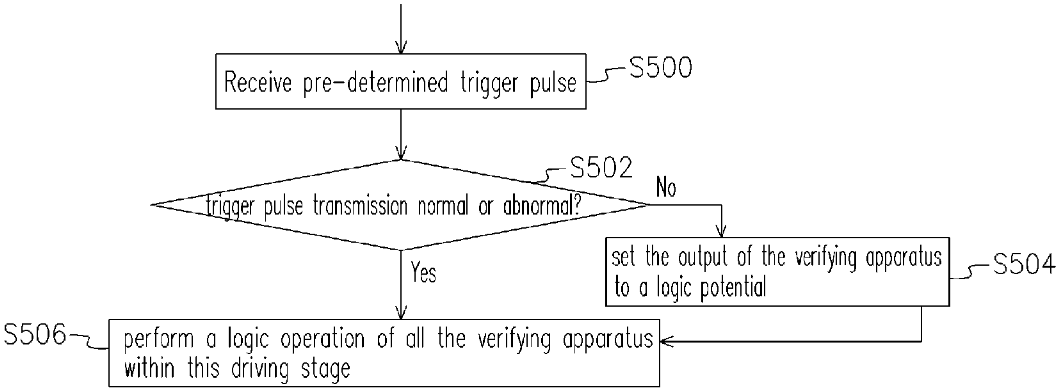
FIG. 5 is a flow chart showing an error tolerance method for a liquid crystal display driving circuit according to one preferred embodiment of this invention.

FIG. 5 is a flow chart showing an error tolerance method for a liquid crystal display driving circuit according to one preferred embodiment of this invention. The liquid crystal display driving circuit comprises a plurality of driving circuits. Each driving circuit has a plurality of verifying apparatus with each verifying apparatus having a storage unit for holding driving signals. In this embodiment, the verifying apparatus must receive a pre-defined trigger pulse (S500) during a testing operation. Thereafter, the trigger pulse is checked to determine if its transmission is normal or not (S502). If the trigger pulse transmission is found to be abnormal, the output terminal of the verifying apparatus undergoing the test is set to a pre-defined logic potential (S504). The driving stage outputs a result after the output from all the verifying apparatus have been combined together in a logic operation (S506).

Similarly, the output from a verifying apparatus determined to be abnormal will not affect normal transmission signals. Since the reason for this have been explained before, detailed description omitted here.

Figure 6:
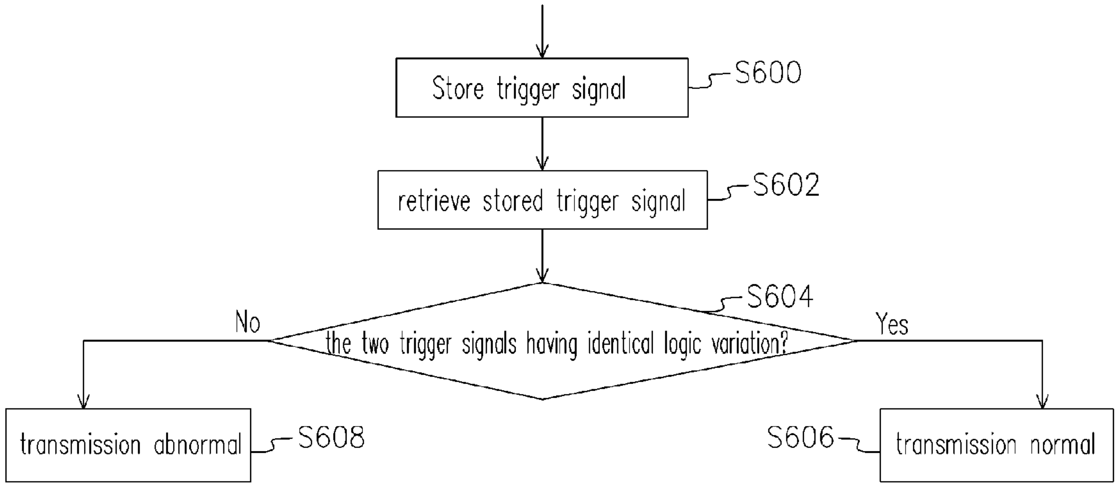
FIG. 6 is a flow chart showing the steps of applying the error tolerance method according to this invention to determine any abnormality in the liquid crystal display driving circuit.

FIG. 6 is a flow chart showing the steps of applying the error tolerance method according to this invention to determine any abnormality in the liquid crystal display driving circuit. First, the verifying apparatus to be used in the testing operation must store up a trigger signal (S600). Thereafter, the data is read out from a storage unit holding the trigger pulse (S602). The logic variation of subsequently read data is compared with the logic variation of previously read data from the storage unit to determine if they are identical (S604). If the respective logic variations are identical, the data transmitted through the verifying apparatus is judged to be normal (S606). Otherwise, the data transmitted through the verifying apparatus is judge to be abnormal (S608).

In summary, this invention uses simple circuit structure to detect and maintain transmission accuracy in each driving stage. The correct output value is transmitted from the driving stages most of the time even if some of defective storage units output stuck-at-zero or stuck-at-one values.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. A verifying apparatus for a liquid crystal driving circuit having a plurality of driving stages, comprising:

a storage unit for receiving and storing a first trigger pulse during a first time period and receiving and storing a second trigger pulse during a second time period, and then sequentially outputting a first shifted signal and a second shifted signal that correspond to the stored first and second trigger pulse;

a first data switch electrically coupled to the output terminal of the storage unit so that the output terminal of the first data switch is electrically connected to a first output path during the first time period and the output terminal of the first data switch is electrically connected to a second output path during the second time period; and an edge detector having an input terminal electrically connected to the first output path and an output terminal electrically connected to the second output path, wherein if no edge transition is detected during the first time period, the second output path is set to a pre-defined logic potential during the second time period.

2. The verifying apparatus of claim 1, wherein the apparatus furthermore comprises a second data switch having an output terminal that serves as an input terminal to the storage unit, an input terminal electrically connected to the output terminal of a driving stage two driving stages before for receiving the first trigger pulse and a second input terminal electrically connected to the output terminal of a driving stage one driving stage before for receiving the second trigger pulse.

3. The verifying apparatus of claim 1, wherein the storage unit comprises a shift register.

4. A liquid crystal display driving circuit having a plurality of driving stages with each driving stage comprising:

a plurality of verifying apparatus with each verifying apparatus having:

a storage unit for receiving and storing a first trigger pulse during a first time period and receiving and storing a second trigger pulse during a second time period, and then sequentially outputting a first shifted signal and a second shifted signal that correspond to the stored first and second trigger pulse;

a first data switch electrically coupled to the output terminal of the storage unit so that the output terminal of the first data switch is electrically connected to a first output path during the first time period and the output terminal of the first data switch is electrically connected to a second output path during the second time period;

an edge detector having an input terminal electrically connected to the first output path and an output terminal electrically connected to the second output path, wherein if no edge transition is detected during the first time period, the second output path is set to a pre-defined logic potential during the second time period;

a logic operation unit with a receiving terminal electrically connected to the second output path of various verifying apparatus for executing a corresponding logic operation according to the pre-defined logic potential so that the output from the logic operation unit is unaffected by the pre-defined logic potential; and a driving switch for cutting off the electrical connection of the driving stage with a pixel circuit during a first time period but reconnecting with the pixel circuit during the second time period.

5. The liquid crystal display driving circuit of claim 4, wherein the logic operation unit executes a logic 'AND' operation when the pre-defined logic potential is at a logic level '1'.

6. The liquid crystal display driving circuit of claim 4, wherein the logic operation unit executes a logic 'OR' operation when the pre-defined logic potential is at a logic level '0'.

7. The liquid crystal display driving circuit of claim 4, wherein each verifying apparatus furthermore comprises a second data switch having an output terminal that serves as an input terminal to the storage unit, an input terminal electrically connected to the output terminal of a driving stage two driving stages before for receiving the first trigger pulse and a second input terminal electrically connected to the output terminal of a driving stage one driving stage before for receiving the second trigger pulse.

8. The liquid crystal display driving circuit of claim 4, wherein the number of verifying apparatus inside the display is two.

9. The liquid crystal display driving circuit of claim 4, wherein the storage unit comprises a shift register.

10. An error tolerance method for a liquid crystal display driving circuit having a driving circuit with a plurality of verifying apparatus therein, wherein each verifying apparatus comprises a storage unit for holding driving signals, the error tolerance method comprising the steps of:

receiving a pro-determined trigger pulse;

checking to determine if the trigger pulse transmitted via the storage unit is normal or not;

setting the output terminal of the verifying apparatus to a pre-defined logic potential if the trigger pulse transmitted from the storage unit is found to be abnormal; and executing a logic operation that correspond to the pre-defined logic potential so that the result from the logic operation is unaffected by the pre-defined logic potential.

11. The error tolerance method of claim 10, wherein the step of determining if the trigger pulse transmitted from the storage unit is normal or not comprising:

transferring the trigger pulse to the storage unit;

retrieving the trigger pulse data from the storage unit;

determining if the trigger pulse data has the same logical variation as the original trigger pulse; and judging the transmitted trigger pulse to be normal if the trigger pulse data from the storage unit and the original trigger pulse are identical, otherwise, judging the transmitted trigger pulse to be abnormal.

12. The error tolerance method of claim 10, wherein the logic operation is an 'AND' operation when the pre-defined logic potential is at a logic level '1'.

13. The error tolerance method of claim 10, wherein the logic operation is an 'OR' operation when the pre-defined logic potential is at a logic level '0'.

* * * * *